(12) United States Patent
Choi et al.

(10) Patent No.: US 8,124,524 B2
(45) Date of Patent: Feb. 28, 2012

(54) METHODS OF FORMING METAL INTERCONNECTION STRUCTURES

(75) Inventors: Kyung-In Choi, Seoul (KR); Sang-Woo Lee, Seoul (KR); Jong-Myeong Lee, Gyeonggi-do (KR); Jong-Won Hong, Gyeonggi-do (KR); Hyun-Bae Lee, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 11 days.

(21) Appl. No.: 12/711,812

(22) Filed: Feb. 24, 2010

(65) Prior Publication Data

US 2010/0151672 A1   Jun. 17, 2010

Related U.S. Application Data

(62) Division of application No. 11/770,631, filed on Jun. 28, 2007, now abandoned.

(30) Foreign Application Priority Data

Jun. 28, 2006   (KR) ........................ 10-2006-0058961

(51) Int. Cl.
  *H01L 21/4763* (2006.01)
(52) U.S. Cl. .. 438/627; 438/643; 438/653; 257/E21.584
(58) Field of Classification Search ................. 438/627; 257/E21.584
See application file for complete search history.

(56) References Cited

U.S. PATENT DOCUMENTS

| 7,067,409 B2 | 6/2006 | Tsai et al. | |
| 2001/0053596 A1* | 12/2001 | Wang et al. | 438/597 |
| 2004/0207093 A1 | 10/2004 | Sun et al. | |
| 2006/0199372 A1* | 9/2006 | Chung et al. | 438/628 |

FOREIGN PATENT DOCUMENTS

| JP | 11-340330 | 12/1999 |
| KR | 2001-0065289 | 7/2001 |
| KR | 2002-0058430 | 7/2002 |
| KR | 2003-0047367 | 6/2003 |

OTHER PUBLICATIONS

English language abstract of Japanese Publication No. 11-340330.
English language abstract of Korean Publication No. 2001-0065289.
English language abstract of Korean Publication No. 2002-0058430.
English language abstract of Korean Publication No. 2003-0047367.

* cited by examiner

*Primary Examiner* — Michael Lebentritt
*Assistant Examiner* — Daniel Whalen
(74) *Attorney, Agent, or Firm* — Myers Bigel Sibley & Sajovec, P.A.

(57) ABSTRACT

Methods of forming a metal interconnection structure are provided. The methods include forming an insulating layer on a semiconductor substrate including a first metal interconnection. The insulating layer is patterned to form an opening that exposes the first metal interconnection. A first diffusion barrier layer is formed on the exposed first metal interconnection. After forming the first diffusion barrier layer, a second diffusion barrier layer is formed on the first diffusion barrier layer in the opening, the second diffusion barrier layer contacting a sidewall of the opening. A second metal interconnection is formed on the second diffusion barrier layer.

9 Claims, 6 Drawing Sheets

METHODS OF FORMING METAL INTERCONNECTION STRUCTURES

CLAIM OF PRIORITY

The present application is a divisional of and claims priority from U.S. patent application Ser. No. 11/770,631, filed Jun. 28, 2007, now abandoned which claims the benefit of Korean Patent Application No. 10-2006-58961, filed on Jun. 28, 2006, the disclosures of which are hereby incorporated by reference herein in their entireties.

BACKGROUND

1. Technical Field

The present invention relates to a semiconductor integrated circuit and, more particularly, to metal interconnection structures in a semiconductor integrated circuit and methods of forming the same.

2. Description of the Related Art

As semiconductor devices having metal interconnections become more highly integrated, the width and the thickness of the metal interconnections have been reduced, resulting in a drastic increase in the electrical resistance of the metal interconnections. A copper interconnection having low resistivity is very attractive as a candidate for reducing the electrical resistance of the metal interconnections. The copper interconnection can be formed using a damascene technique. However, the copper interconnection may be easily oxidized. Thus, in the event that bonding pads of the semiconductor devices are formed from the copper layer, bonding fails may be generated during a wire bonding process for manufacturing semiconductor packages due to oxidation of the copper. Accordingly, an aluminum layer is still used in formation of the bonding pads on the copper interconnection.

FIG. 1 is a cross sectional view illustrating a method of forming conventional metal interconnections. Referring to FIG. 1, an insulating layer 30 is formed on a semiconductor substrate 10 including a lower copper interconnection 15. An upper copper interconnection 65, which is electrically connected to the lower copper interconnection 15, is formed in the insulating layer 30. The upper copper interconnection 65 is formed using a dual damascene technique. A diffusion barrier layer 75 and an aluminum pad 85, which are sequentially stacked, are formed on the upper copper interconnection 65. The diffusion barrier layer 75 and the aluminum pad 85 are formed by sequentially depositing a titanium layer, a titanium nitride layer and an aluminum layer on the insulating layer 30 and the upper copper interconnection 65 and by successively patterning the aluminum layer, the titanium layer and the titanium nitride layer using a reactive ion etching (RIE) technique.

According to the conventional art as described above, an additional process for forming the aluminum pad 85 is required after formation of the upper copper interconnection 65. Thus, the conventional art requires a complicated metallization process.

Recently, a method of replacing the upper copper interconnection 65 with an aluminum interconnection has been proposed. Such a method does not require formation of the aluminum pad 85, which simplifies the metallization process. In this case, however, copper atoms in the lower copper interconnection 15 may be diffused into the aluminum interconnection, thereby generating voids in the lower copper interconnection 15 and degrading the reliability thereof. Consequently, a method of simplifying the metallization process during formation of metal interconnections that does not result in void formation due to metal atom diffusion is desired.

SUMMARY

Embodiments of the invention provide a metal interconnection structure and a method of forming the same. Some embodiments of the invention provide a metal interconnection comprising a copper interconnection and an aluminum bonding pad.

According to embodiments of the invention, the method comprises forming an insulating layer on a semiconductor substrate including a first metal interconnection; patterning the insulating layer to form an opening that exposes the first metal interconnection; forming a first diffusion barrier layer on the exposed first metal interconnection, the first diffusion barrier layer comprising at least one material selected from the group consisting of aluminum(Al), zirconium(Zr), silicon (Si), molybdennum(Mo), cobalt(Co), tungsten(W), ruthenium(Ru), and nickel(Ni); and forming a second metal interconnection on the first diffusion barrier layer.

BRIEF DESCRIPTION OF THE DRAWINGS

Preferred embodiments of the invention can be understood in more detail from the following descriptions taken in conjunction with the accompanying drawings in which.

DETAILED DESCRIPTION

Figure 1:
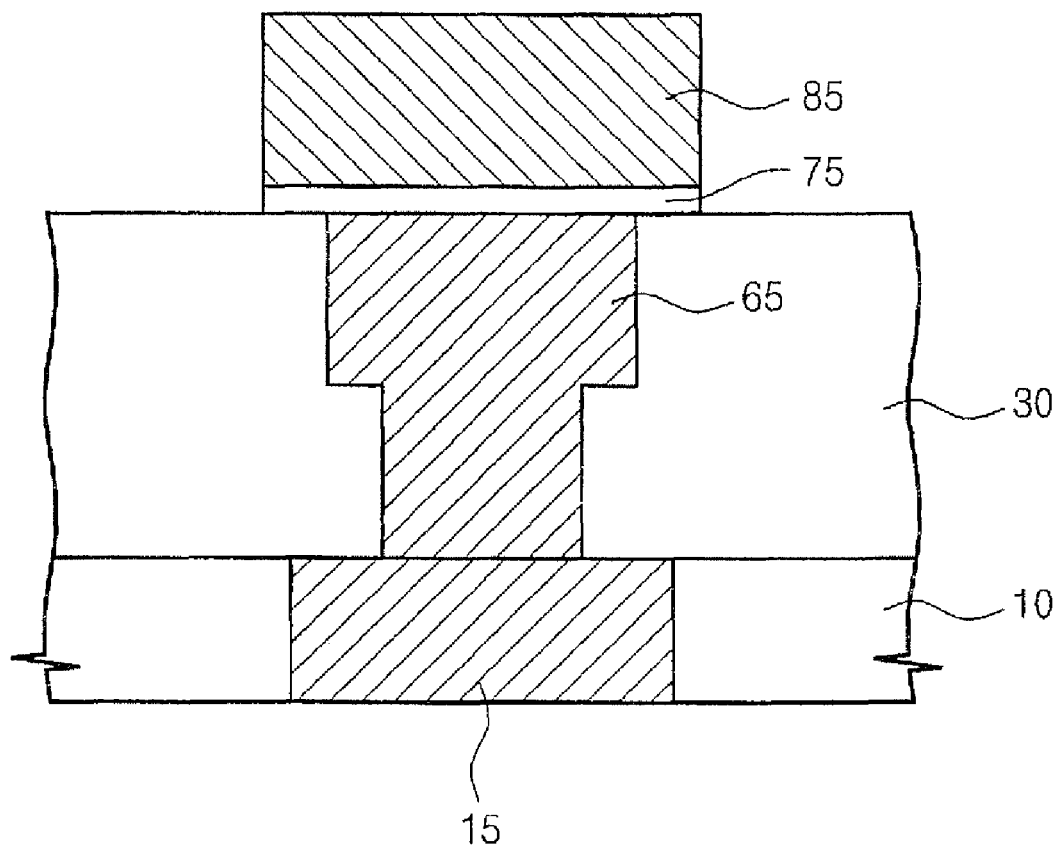
FIG. 1 is a cross sectional view illustrating a method of forming a conventional metal interconnection structure.

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art.

In the specification, although the terms first, second, etc. may be used herein to describe a metal interconnection, a diffusion barrier layer or a material layer, these material layers should not be limited by these terms. These terms are only used to distinguish a specific metal interconnection, a specific diffusion barrier layer or a specific material layer from another metal interconnection, another diffusion barrier layer or another material layer. Further, it will be understood that when a layer is referred to as being "on" another layer or substrate, it can be directly on the other layer or substrate, or intervening layers may also be present. When a layer is referred to as being "directly on" another layer or substrate, there are no intervening layers present. As used herein, the term and/or includes any and all combinations of one or more of the associated listed items. In the drawings, the thickness of layers and regions are exaggerated for clarity.

Figure 2:
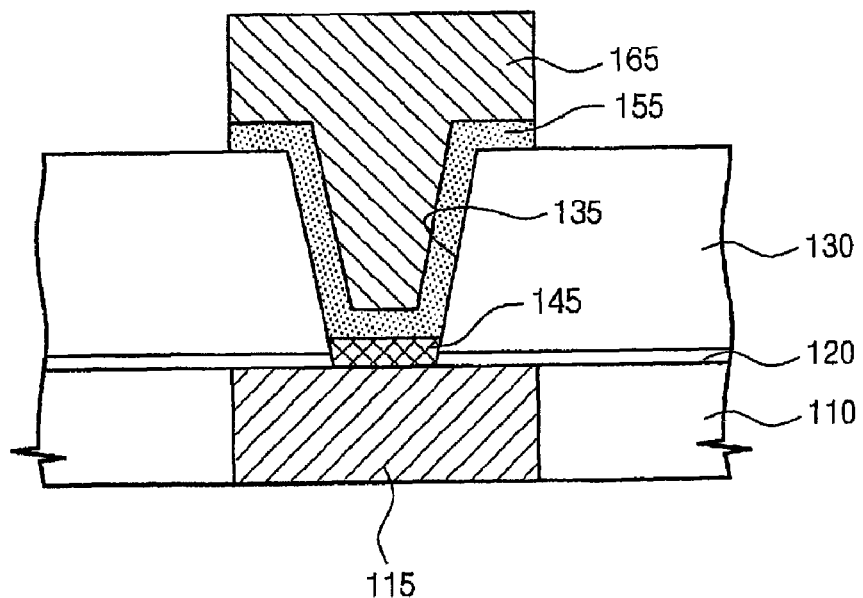
FIG. 2 is a cross sectional view illustrating a metal interconnection structure according to an exemplary embodiment of the invention.

FIG. 2 is a cross sectional view illustrating a metal interconnection structure according to an exemplary embodiment of the invention.

Referring to FIG. 2, a first metal interconnection 115 may be disposed in a semiconductor substrate 110. The first metal interconnection 115 may be electrically connected to various discrete devices (not shown). For example, the first metal interconnection 115 may be electrically connected to active devices such as transistors or other metal interconnections. The first metal interconnection 115 may be a copper interconnection, and both sidewalls and a bottom surface of the first metal interconnection 115 may be covered with a diffusion barrier layer (not shown).

An etch stop layer 120 is disposed on the semiconductor substrate 110 including the first metal interconnection 115. The etch stop layer 120 may prevent a top surface of the first metal interconnection 115 from being damaged due to over-etching during formation of an opening 135 for exposing the first metal interconnection 115. The etch stop layer 120 may comprise silicon nitride(SiN), silicon carbide(SiC) or silicon carbide nitride(SiCN), and the etch stop layer 120 may function as a diffusion barrier layer that prevents metal atoms (for example, copper atoms) in the first metal interconnection 115 from being diffused into a layer thereon. An insulating layer 130 is disposed on the etch stop layer 120. The insulating layer 130 may comprise a fluorosilicate glass (FSG) layer, a tetraethylorthosilicate (TEOS) layer, a high density plasma (HDP) oxide layer or a low-k dielectric layer.

The first metal interconnection 115 is exposed by an opening 135 that penetrates the insulating layer 130 and the etch stop layer 120, and a first diffusion barrier layer 145 is disposed on the exposed first metal interconnection 115. The first diffusion barrier layer 145 may have a thickness of 0.5 to 1000 angstroms (Å). The first diffusion barrier layer 145 may comprise at least one material selected from the group consisting of aluminum(Al), zirconium(Zr), silicon(Si), molybdenum(Mo), cobalt(Co), tungsten(W), ruthenium(Ru) and nickel(Ni). The first diffusion barrier layer 145 may further comprise an oxide of the selected material. For example, the first diffusion barrier layer 145 may comprise an aluminum (Al) layer and aluminum oxide ($Al_2O_3$) therein. Further, the first diffusion barrier layer 145 may comprise a compound layer, which is formed by reaction of the selected material and metal in the first metal interconnection 115. For example, when the selected material is aluminum(Al) and the first metal interconnection 115 is a copper(Cu) interconnection, the compound layer may be a copper-aluminum alloy layer.

A second diffusion barrier layer 155 and a second metal interconnection 165 are disposed on the first diffusion barrier layer 145. The second diffusion barrier layer 155 may extend to cover a sidewall of the opening 135, and the second metal interconnection 165 fills the opening 135 surrounded by the second diffusion barrier layer 155. Accordingly, the second metal interconnection 165 may be electrically connected to the first metal interconnection 115 through the first diffusion barrier layer 145. The second metal interconnection 165 may comprise a plug portion that extends to fill the opening 135 as described above. Thus, the plug portion may prevent the second metal interconnection layer 165 from being lifted. The second diffusion barrier layer 155 may comprise titanium (Ti), titanium nitride(TiN), tantalum(Ta) or tantalum nitride (TaN), and the second metal interconnection 165 may comprise aluminum(Al). The second diffusion barrier layer 155 may prevent metal atoms (e.g., aluminum atoms) in the second metal interconnection 165 from being diffused into the insulating layer 130. Further, the second diffusion barrier layer 155 may function as a wetting layer that improves the adsorption and the reflowability of the second metal interconnection 165.

According to the embodiment described above, the first diffusion barrier layer 145 between the first and second metal interconnections 115 and 165 can prevent the metal atoms in the first metal interconnection 115 from being diffused into the second metal interconnection 165. For example, when the first metal interconnection 115 is a copper interconnection and the second metal interconnection 165 is an aluminum interconnection, copper atoms in the first metal interconnection 115 may not be diffused into the second metal interconnection 165 even though the second metal interconnection 165 is formed of aluminum at a high temperature of about 500 to 600 degrees Celsius. In particular, when the first diffusion barrier layer 145 comprises oxide (e.g., aluminum oxide) and/or a compound layer (e.g., a copper-aluminum alloy layer) as described above, the diffusion barrier effect between the first and second metal interconnections 115 and 165 may be further improved.

Figure 3:
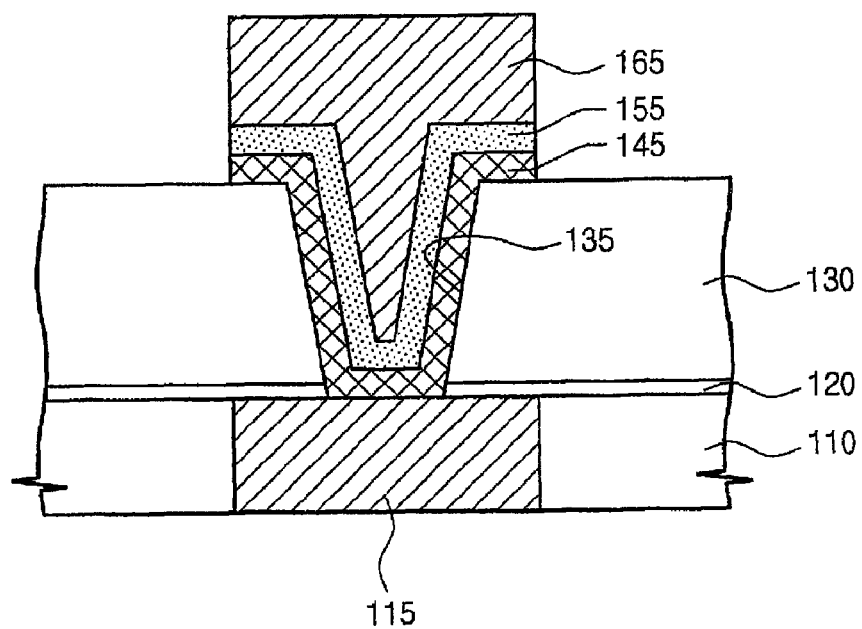
FIG. 3 is a cross sectional view illustrating a metal interconnection structure according to another exemplary embodiment of the invention.

FIG. 3 is a cross sectional view illustrating a metal interconnection structure according to another exemplary embodiment of the invention. Referring to FIG. 3, this embodiment is different from the previous embodiment illustrated in FIG. 2 in terms of the first diffusion barrier layer 145. In the present embodiment, the first diffusion barrier layer 145 is disposed between the first metal interconnection 115 and the second diffusion barrier layer 155, and the first diffusion barrier layer 145 extends to cover a sidewall of the opening 135. Thus, the contact area between the first and second diffusion barrier layers 145 and 155 of the present embodiment may be greater than the contact area between the first and second diffusion barrier layers 145 and 155 of the previous embodiment illustrated in FIG. 2. Further, the first diffusion barrier layer 145 may be an alloy layer including titanium aluminum nitride(TiAlN). Alternatively, the first diffusion barrier layer 145 may comprise a plurality of grains consisting of titanium (Ti) or titanium nitride (TiN), and at least one material selected from the group consisting of aluminum(Al), zirconium(Zr), silicon(Si), molybdenum(Mo), cobalt(Co), tungsten(W), ruthenium(Ru) and nickel(Ni). Regions between the grains are filled with the selected material.

FIGS. 4 to 7 are cross sectional views illustrating a method of forming a metal interconnection structure according to an embodiment of the present invention.

Figure 4:
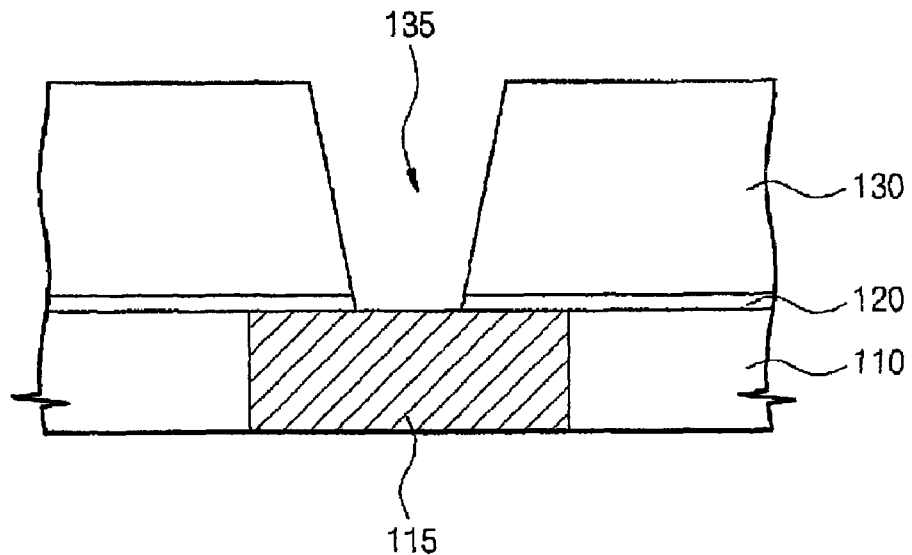
FIGS. 4 to 7 are cross sectional views illustrating a method of forming a metal interconnection structure according to an exemplary embodiment of the invention.

Referring to FIG. 4, an etch stop layer 120 and an insulating layer 130 are sequentially formed on a semiconductor substrate 110 including a first metal interconnection 115. The first metal interconnection 115 may be formed of a copper layer using a damascene technique. A diffusion barrier layer (not shown) surrounding both sidewalls and a bottom surface of the first metal interconnection 115 may be additionally formed. A diffusion barrier layer may be formed in the substrate 110 prior to formation of the first metal interconnection 115. The etch stop layer 120 may be formed of silicon nitride (SiN), silicon carbide(SiC) or silicon carbon nitride(SiCN), and the insulating layer 130 may be formed of fluorosilicate glass(FSG), tetraethylorthosilicate(TEOS), high density plasma(HDP) oxide or low-k dielectric insulating material. Each of the etch stop layer 120 and the insulating layer 130 may be formed by well known deposition processes.

The insulating layer 130 and the etch stop layer 120 are patterned to form an opening 135 which exposes a portion of the first metal interconnection 115. The etch stop layer 120 may prevent a top surface of the first metal interconnection 115 from being damaged due to an over-etching process during formation of the opening 135.

Figure 5:
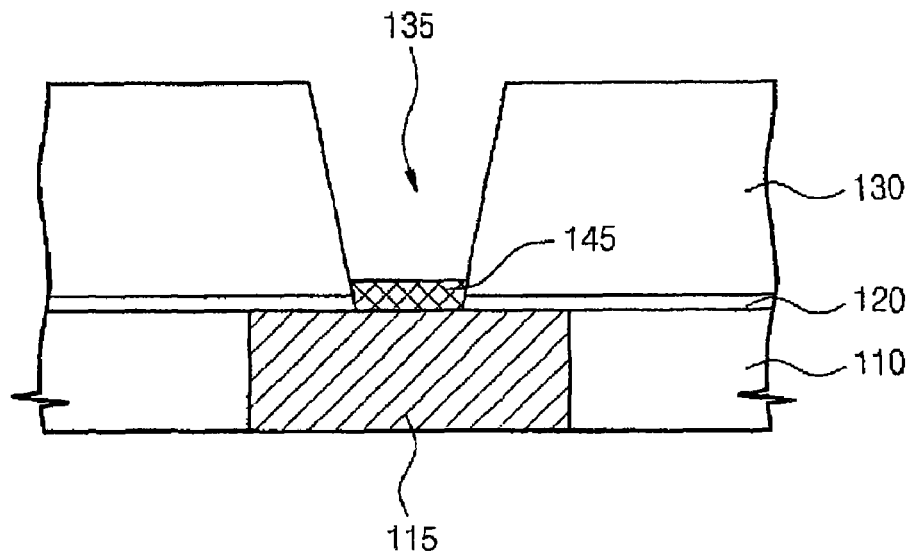

Referring to FIG. 5, a first diffusion barrier layer 145 is formed on the first metal interconnection 115. The first diffusion barrier layer 145 may be selectively formed on the exposed portion of the first metal interconnection 115 by performing a chemical vapor deposition (CVD) process, an electroplating process or an electroless plating process. Here, the expression "may be selectively formed" means that when two or more exposed layers are disposed on a semiconductor substrate, a certain layer may be formed only on one layer of the exposed layers. Accordingly, the first diffusion barrier layer 145 is formed only on a surface of the exposed first metal interconnection 115 and is not formed on a sidewall of the opening 135 (that is, on the insulating layer 130). The first diffusion barrier layer 145 may be formed of at least one material selected from the group consisting of aluminum(Al), zirconium(Zr), silicon(Si), molybdenum(Mo), cobalt(Co), tungsten(W), ruthenium(Ru) and nickel(Ni). The first diffusion barrier layer 145 may be formed to a thickness of about 0.5 to about 1000 angstroms (Å).

The first diffusion barrier layer 145 may react with the first metal interconnection 115 during formation of the first diffusion barrier layer 145, thereby forming a compound layer (not shown) at an interface between the first diffusion barrier layer 145 and the first metal interconnection 115. Alternatively, the compound layer may be formed by performing a separate annealing process after formation of the first diffusion barrier layer 145. When the first metal interconnection 115 is formed of copper and the first diffusion barrier layer 145 is formed of aluminum, the compound layer may be a copper-aluminum alloy layer.

Further, oxide of the selected material may be additionally formed in the first diffusion barrier layer 145. For example, when the first diffusion barrier layer 145 is formed of aluminum(Al), aluminum oxide may be formed in the first diffusion barrier layer 145.

The compound layer and/or the oxide may further densify the first diffusion barrier layer 145 to further improve the diffusion barrier function of the first diffusion barrier layer 145.

Figure 6:
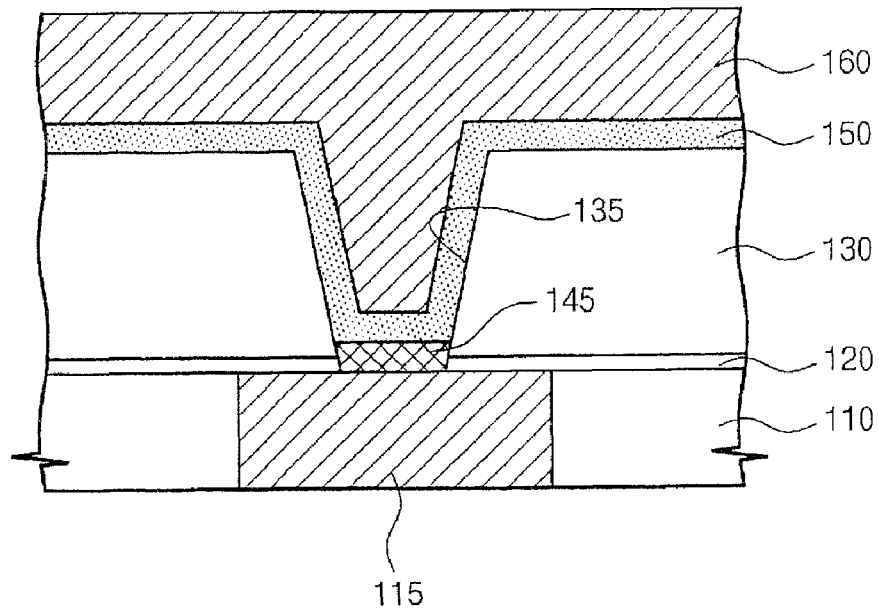

Referring to FIG. 6, a material layer 150 and a metal layer 160 are sequentially formed on an entire surface of the substrate having the first diffusion barrier layer 145. The material layer 150 may be formed of at least one of titanium(Ti), titanium nitride(TiN), tantalum(Ta) or tantalum nitride(TaN) by performing a well known deposition process such as a CVD process, a physical vapor deposition(PVD) process or an atomic layer deposition(ALD) process. The material layer 150 prevents metal atoms in the metal layer 160 from being diffused and reacting with the insulating layer 130 and improves the adsorption and/or the reflowability of the metal layer 160. The metal layer 160 may be fowled of aluminum performing a well known deposition process such as a CVD process and/or a PVD process. The PVD process may comprise a low temperature process and a high temperature process. That is, the low temperature process may be performed and then the high temperature process or a reflow process may be performed.

When the metal layer 160 is formed using the high temperature PVD process according to conventional methods as described above, metal atoms (e.g., copper atoms) in the first metal interconnection 115 may be diffused into the metal layer 160 during formation of the metal layer 160. In particular, there may be a limitation in suppressing the metal atoms in the first metal interconnection 115 from being diffused into the metal layer 160 using only the material layer 150 including a material of titanium(Ti) or tantalum(Ta). However, according to the present embodiment, the first diffusion barrier layer 145 in addition to the material layer 150 can prevent the diffusion of the metal atoms in the first metal interconnection 115, as described above. Moreover, the first diffusion barrier layer 145 may be formed to include the oxide and/or the compound layer therein, as described above. For example, when the first metal interconnection 115 is formed of copper and the first diffusion barrier layer 145 is formed of aluminum, the first diffusion barrier layer 145 may include copper-aluminum alloy and/or aluminum oxide therein. Therefore, the first diffusion barrier layer 145 may become more densified in film quality to function as an excellent diffusion barrier layer. Thus, the reliability of the first metal interconnection 115 may not be degraded even though the metal layer 160 is formed using a high temperature process.

Figure 7:
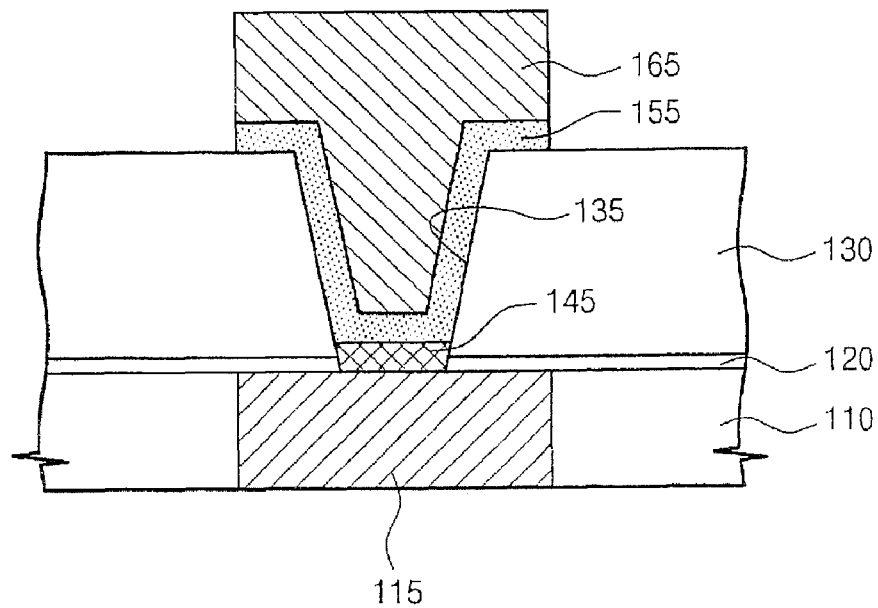

Referring to FIG. 7, the material layer 150 and the metal layer 160 are patterned to form a second diffusion barrier layer 155 and a second metal interconnection 165. The second diffusion barrier layer 155 is formed to cover a surface of the first diffusion barrier layer 145 and a sidewall of the opening 135, and the second metal interconnection 165 is formed on the second diffusion barrier layer 155.

According to the embodiment described above, the first diffusion barrier layer 145 is formed between the first and second metal interconnections 115 and 165. Thus, the second metal interconnection 165 may be formed of aluminum to provide a bonding pad, even though the first metal interconnection 115 is formed of copper. Therefore, an aluminum bonding pad may be easily formed together with the copper interconnection using a simplified metallization process. Further, the second metal interconnection 165 may be formed to have a plug portion that fills the opening 135 in the insulating layer 130. Accordingly, the plug portion can prevent the second metal interconnection 165 from being lifted.

FIGS. 8 to 11 are cross sectional views illustrating a method of forming a metal interconnection structure according to another embodiment of the present invention.

Figure 8:
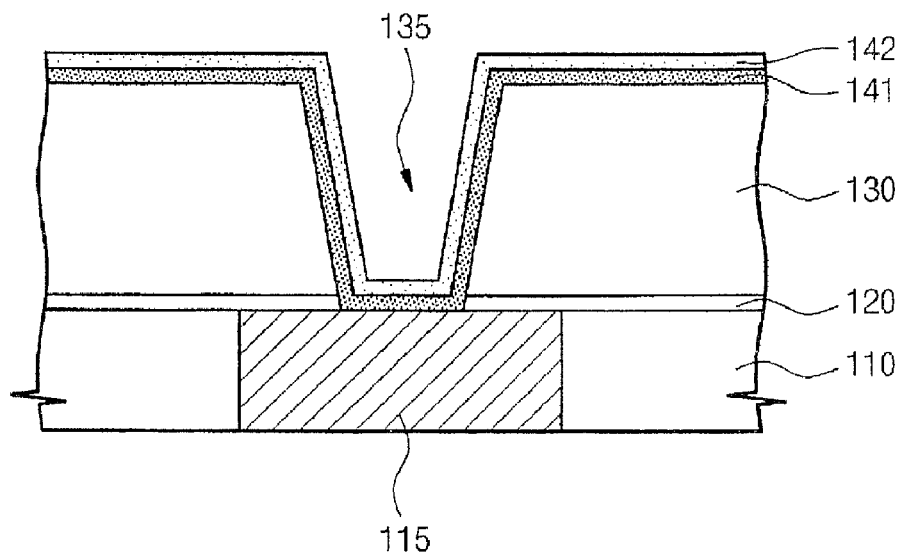
FIGS. 8 to 11 are cross sectional views illustrating a method of forming a metal interconnection structure according to another exemplary embodiment of the invention.

Referring to FIG. 8, a first metal interconnection 115, an etch stop layer 120, an insulating layer 130 and an opening 135 may be formed using the same method as described above with reference to FIG. 4. A first material layer 141 and a second material layer 142 are sequentially formed on the substrate having the opening 135. The first material layer 141 may be formed of at least one of titanium(Ti), titanium nitride (TiN), tantalum(Ta) and tantalum nitride(TaN) by performing a well known deposition process, and the second material layer 142 may be formed of at least one material selected from the group consisting of aluminum(Al), zirconium(Zr), silicon (Si), molybdenum(Mo), cobalt(Co), tungsten(W), ruthenium (Ru) and nickel(Ni) by performing a well known deposition process. The well known deposition process may comprise a CVD process, a PVD process or an ALD process. In another embodiment, the second material layer 142 may be foamed prior to formation of the first material layer 141. In yet another embodiment, the first and second material layers 141 and 142 may be formed repeatedly. In other words, more than one layer of the first and second material layers 141 and 142 may be sequentially stacked on the insulating layer 130.

Figure 9:
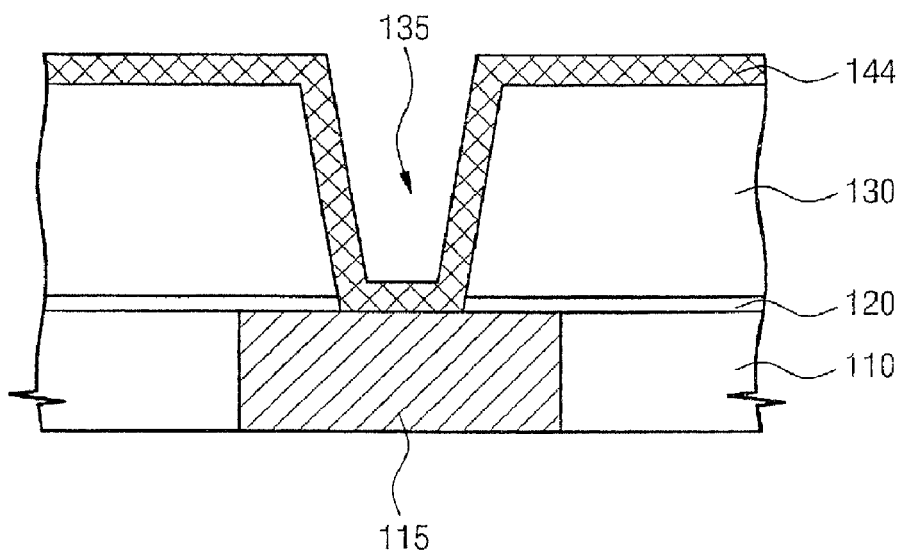

Referring to FIG. 9, an annealing process may be applied to the substrate having the first and second material layers 141 and 142. As a result, at least a portion of the first material layer 141 and at least a portion of the second material layer 142 may react with each other during the annealing process, thereby forming a third material layer 144. For example, the first and second material layers 141 and 142 may entirely react with each other during the annealing process. In another embodiment, only a portion of the first material layer 141 may react with the entire portion of the second material layer 142 during the annealing process or vice versa. In yet another embodiment, a portion of the first material layer 141 may react with a portion of the second material layer 142 during the annealing process. Accordingly, at least one of the first and second material layers 141 and 142 may exist after the annealing process. When the first and second material layers 141 and 142 are respectively formed of titanium nitride(TiN) and aluminum(Al), the third layer 144 may be a titanium aluminum nitride (TiAlN) layer.

Further, the second material layer 142 may react with the first metal interconnection 115 during the annealing process. For example, when the first metal interconnection 115 and the second material layer 142 are respectively formed of copper and aluminum, the third layer 144 may comprise a copper-aluminum alloy layer formed at an interface between the first metal interconnection 115 and the first material layer 141. In addition, the third material layer may comprise aluminum oxide aimed during the annealing process.

In other embodiments, the first and second material layers 141 and 142 may not react with each other. The second material layer 142 may be formed to a very thin thickness. In this case, even though the annealing process is omitted, atoms (e.g., aluminum atoms) of the second material layer 142 may be easily diffused into the first material layer 141 (e.g., a TiN layer) to fill grain boundaries of first material layer 141 even without application of the annealing process.

As described above, the third material layer 144 may comprise a titanium aluminum nitride (TiAlN) and/or an aluminum oxide($Al_3O_2$). Thus, the third material layer 144 may have a dense film quality which is sufficient to function as an excellent diffusion barrier layer.

Figure 10:
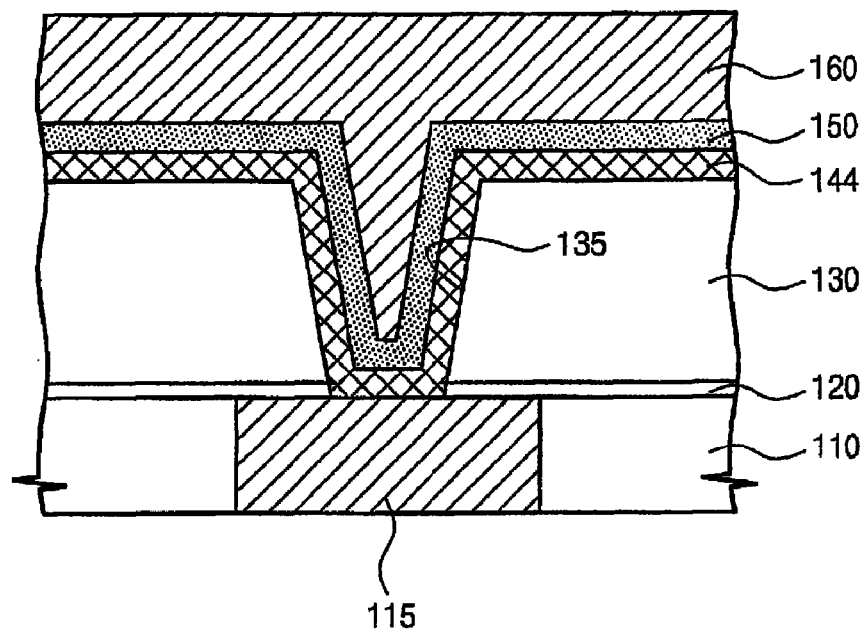

Referring to FIG. 10, a fourth material layer 150 and a metal layer 160 may be sequentially formed on the third material layer 144. The fourth material layer 150 may be formed of at least one of titanium(Ti), titanium nitride(TiN), tantalum (Ta) or tantalum nitride(TaN) by performing a well known deposition process such as a CVD process, a physical vapor deposition(PVD) process or an atomic layer deposition (ALD) process. The fourth material layer 150 prevents metal atoms in the metal layer 160 from being diffused into the insulating layer 130 and improves the adsorption and/or the reflowability of the metal layer 160. The metal layer 160 may be formed of aluminum by performing a well known deposition process. For example, the metal layer 160 may be formed by performing a CVD process and/or a PVD process. The PVD process may comprise a low temperature process and a high temperature process. That is, the low temperature process may be performed and then the high temperature process or a reflow process may be performed.

When the metal layer 160 is formed using the high temperature PVD process using the conventional method as described above, metal atoms (e.g., copper atoms) in the first metal interconnection 115 may be diffused into the metal layer 160 during formation of the metal layer 160. In particular, there may be a limitation in suppressing the metal atoms in the first metal interconnection 115 from being diffused into the metal layer 160 using only the fourth material layer 150 including a material of titanium(Ti) or tantalum(Ta). However, the present embodiment provides the third material layer 144 in addition to the fourth material layer 150, as described above. Moreover, the third material layer 144 may be formed to include the aluminum oxide ($Al_3O_2$) layer and/or the titanium aluminum nitride (TiAlN) layer therein, as described above. Therefore, the third material layer 144 may become more densified in film quality to act as an excellent diffusion barrier layer. Thus, the reliability of the first metal interconnection 115 may not be degraded even though the metal layer 160 is formed using a high temperature process.

Figure 11:
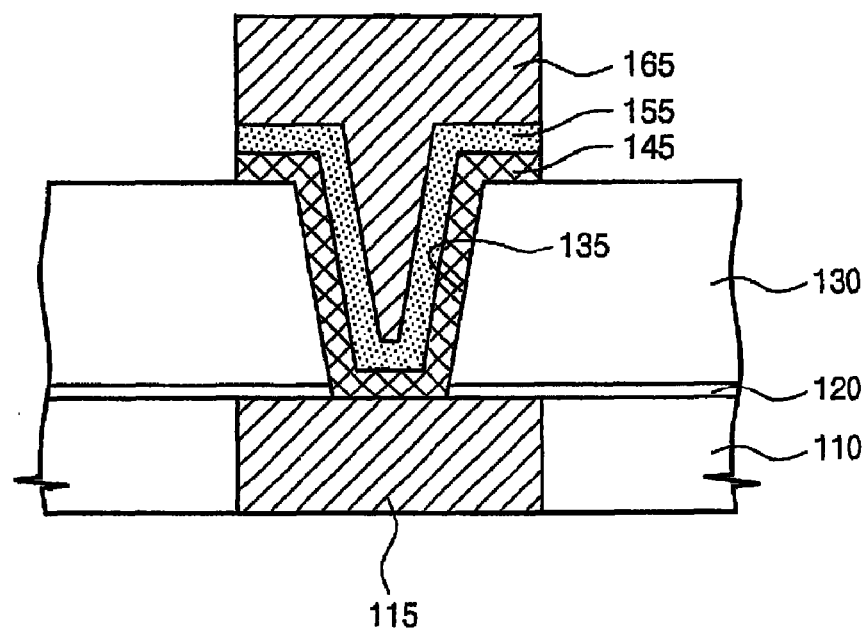

Referring to FIG. 11, the metal layer 160, the fourth material layer 150 and the third material layer 144 are patterned to form a first diffusion barrier layer 145, a second diffusion barrier layer 155 and a second metal interconnection 165. According to the present embodiment, the first diffusion barrier layer 145 is formed between the first and second metal interconnections 115 and 165. Thus, the second metal interconnection 165 may be formed of aluminum to provide a bonding pad, even though the first metal interconnection 115 is formed of copper. Therefore, an aluminum bonding pad may be easily formed together with the copper interconnection without the use of any complicated metallization processes. Further, the second metal interconnection 165 may be formed to have a plug portion that fills the opening 135 in the insulating layer 130. Accordingly, the plug portion can prevent the second metal interconnection 165 from being lifted.

According to embodiments of the invention, the method comprises forming an insulating layer on a semiconductor substrate including a first metal interconnection; patterning the insulating layer to form an opening that exposes the first metal interconnection; forming a first diffusion barrier layer on the exposed first metal interconnection, the first diffusion barrier layer comprising at least one material selected from the group consisting of aluminum(Al), zirconium(Zr), silicon (Si), molybdenum(Mo), cobalt(Co), tungsten(W), ruthenium (Ru), and nickel(Ni); and forming a second metal interconnection on the first diffusion barrier layer.

In one embodiment, the first metal interconnection may comprise copper and the second metal interconnection may comprise aluminum.

In another embodiment, a second diffusion barrier layer may be additionally formed between the first diffusion barrier layer and the second metal interconnection. The second diffusion barrier layer may comprise at least one of titanium(Ti), titanium nitride(TiN), tantalum(Ta) and tantalum nitride (TaN).

In another embodiment, the first diffusion barrier layer may be selectively formed only on the exposed first metal interconnection. The first diffusion barrier layer may be formed by performing a chemical vapor deposition (CVD) process, an electroplating process or an electroless plating process.

In another embodiment, forming the first diffusion barrier layer may comprise making metal in the first metal interconnection and the selected material react with each other to form a compound layer.

In another embodiment, forming the first diffusion barrier layer may comprise performing an annealing process to form an oxide of the selected material in the first diffusion barrier layer.

According to some embodiments of the invention, the method comprises forming an insulating layer on a semiconductor substrate including a first metal interconnection; patterning the insulating layer to form an opening that exposes the first metal interconnection; forming a first material layer and a second material layer on the exposed first metal interconnection, the first material layer comprising at least one of titanium(Ti), titanium nitride(TiN), tantalum(Ta) or tantalum nitride(TaN), and the second material layer comprising at least one material selected from the group consisting of aluminum(Al), zirconium(Zr), silicon(Si), molybdenum(Mo), cobalt(Co), tungsten(W), ruthenium(Ru) and nickel(Ni); making the first material layer and the second material layer react with each other to form a first diffusion barrier layer; and forming a second metal interconnection on the first diffusion barrier layer.

In one embodiment, the first metal interconnection may comprise copper and the second metal interconnection may comprise aluminum.

In another embodiment, a second diffusion barrier layer may be additionally formed between the first diffusion barrier layer and the second metal interconnection. The second diffusion barrier layer may comprise at least one of titanium(Ti), titanium nitride(TiN), tantalum(Ta) or tantalum nitride(TaN).

In another embodiment, forming the first diffusion barrier layer may comprise diffusing the selected material into the first material layer.

In another embodiment, the first material layer and the second material layer may be formed repeatedly.

In another embodiment, the entire portion of the first material layer may react with the entire portion of the second material layer to form the first diffusion barrier layer.

In another embodiment, at least one of the first and second material layers may remain after formation of the first diffusion barrier layer.

According to other embodiments of the invention, the method comprises forming an insulating layer on a semiconductor substrate including a first metal interconnection; patterning the insulating layer to form an opening that exposes the first metal interconnection; forming a first material layer and a second material layer on the exposed first metal interconnection, the first material layer comprising at least one of titanium(Ti) or titanium nitride(TiN), and the second material layer comprising at least one material selected from the group consisting of aluminum(Al), zirconium(Zr), silicon(Si), molybdenum(Mo), cobalt(Co), tungsten(W), ruthenium(Ru) and nickel(Ni); diffusing the selected material into the first material layer to form a first diffusion barrier layer; and forming a second metal interconnection on the first diffusion barrier layer.

In one embodiment, the first metal interconnection may comprise copper and the second metal interconnection may comprise aluminum.

In another embodiment, a second diffusion barrier layer may be additionally formed between the first diffusion barrier layer and the second metal interconnection. The second diffusion barrier layer may comprise at least one of titanium(Ti), titanium nitride(TiN), tantalum(Ta) or tantalum nitride(TaN).

In still another embodiment, the first material layer and the second material layer may be formed repeatedly.

According to some embodiments of the invention, the metal interconnection structure comprises a first metal interconnection and a second metal interconnection; and a first diffusion barrier layer between the first and second metal interconnections, the first diffusion barrier layer including at least one material selected from the group consisting of aluminum(Al), zirconium(Zr), silicon(Si), molybdenum(Mo), cobalt(Co), tungsten(W), ruthenium(Ru) and nickel(Ni).

In one embodiment, the first metal interconnection may comprise copper and the second metal interconnection may comprise aluminum.

In another embodiment, a second diffusion barrier layer may be additionally disposed between the first diffusion barrier layer and the second metal interconnection. The second diffusion barrier layer may comprise at least one of titanium (Ti), titanium nitride(TiN), tantalum(Ta) and tantalum nitride (TaN).

In another embodiment, the first diffusion barrier layer may comprise an oxide of the selected material.

In another embodiment, the first diffusion barrier layer may comprise a compound layer formed by reaction of the selected material and metal in the first metal interconnection.

While the present invention has been particularly shown and described with reference to embodiments thereof, it will be understood by those of ordinary skill in the art that various changes in form and details may be made therein without departing from the spirit and scope of the present invention as defined by the following claims.

That which is claimed is:

1. A method of forming a metal interconnection structure, the method comprising:
    forming an insulating layer on a semiconductor substrate including a first metal interconnection;
    patterning the insulating layer to form an opening that exposes the first metal interconnection;
    forming a first diffusion barrier layer on the exposed first metal interconnection, wherein the first diffusion barrier layer comprises at least one of aluminum and silicon;
    after forming the first diffusion barrier layer, forming a second diffusion barrier layer on the first diffusion barrier layer in the opening, the second diffusion barrier layer contacting a sidewall of the opening; and
    forming a second metal interconnection on the second diffusion barrier layer,
    wherein the first and second metal interconnections comprise different metals.

2. The method of claim 1, wherein the first metal interconnection comprises copper and the second metal interconnection comprises aluminum.

3. The method of claim 1, wherein the second diffusion barrier layer comprises at least one of titanium(Ti), titanium nitride(TiN), tantalum(Ta) or tantalum nitride(TaN).

4. The method of claim 1, wherein the first diffusion barrier layer is selectively formed only on the exposed first metal interconnection.

5. The method of claim 4, wherein forming the first diffusion barrier layer comprises a chemical vapor deposition (CVD) process, an electroplating process or an electroless plating process.

6. The method of claim 1, wherein forming the first diffusion barrier layer comprises reacting the first metal interconnection with the selected material to form a compound layer.

7. The method of claim 1, wherein forming the first diffusion barrier layer further comprises performing an annealing process to form an oxide of the selected material.

8. The method of claim 1, wherein the second diffusion barrier layer contacts a top surface of the first diffusion barrier layer.

9. A method of forming a metal interconnection structure, the method comprising:
    forming an insulating layer on a conductive pattern;
    patterning the insulating layer to form an opening that exposes the conductive pattern;
    forming a first diffusion barrier layer in the opening, wherein the first diffusion barrier layer comprises at least one of aluminum and silicon;
    after forming the first diffusion barrier layer, forming a second diffusion barrier layer on the first diffusion barrier layer in the opening, the second diffusion barrier layer contacting a sidewall of the opening; and
    forming a metal interconnection on the second diffusion barrier layer,
    wherein the conductive pattern and the metal interconnection comprise different metals.

* * * * *